(12) United States Patent
Moon (10) Patent No.: US 8,822,940 B2
(45) Date of Patent: Sep. 2, 2014

(54) X-RAY DETECTION PANEL AND METHOD OF MANUFACTURING THE SAME

(75) Inventor: Jang-Won Moon, Incheon (KR)

(73) Assignee: Samsung Display Co., Ltd., Yongin (KR)

( * ) Notice: Subject to any disclaimer, the term of this patent is extended or adjusted under 35 U.S.C. 154(b) by 313 days.

(21) Appl. No.: 13/458,326

(22) Filed: Apr. 27, 2012

(65) Prior Publication Data

US 2013/0168555 A1    Jul. 4, 2013

(30) Foreign Application Priority Data

Dec. 29, 2011   (KR) .................. 10-2011-0145673

(51) Int. Cl.
*G01T 1/20*    (2006.01)

(52) U.S. Cl.
USPC ............................ 250/370.11; 250/370.09

(58) Field of Classification Search
USPC ....... 250/361 R, 362, 370.08, 370.09, 370.11
See application file for complete search history.

(56) References Cited

U.S. PATENT DOCUMENTS 6,262,422 B1 *   7/2001   Homme et al. .......... 250/370.11

FOREIGN PATENT DOCUMENTS

| JP | 2010-286447 A | 12/2010 |
| KR | 10-2003-0040278 A | 5/2003 |
| KR | 10-2009-0090153 A | 8/2009 |
| WO | 98/36291 A1 | 8/1998 |

* cited by examiner

*Primary Examiner* — Mark R Gaworecki
(74) *Attorney, Agent, or Firm* — Knobbe Martens Olson & Bear LLP (57) ABSTRACT

An X-ray detection panel includes a substrate, a sensor device formed over the substrate, a scintillating layer formed over the sensor device, an adhesion layer formed around the scintillating layer, and a protective film formed over the scintillating layer and the adhesion layer. The X-ray detection panel further includes a side sealing structure formed over a side surface of the adhesion layer, over a side surface of the protective film and over the substrate.

26 Claims, 6 Drawing Sheets

X-RAY DETECTION PANEL AND METHOD OF MANUFACTURING THE SAME

CROSS-REFERENCE TO RELATED APPLICATION

This application claims priority to and the benefit of Korean Patent Application No. 10-2011-0145673, filed Dec. 29, 2011, the disclosure of which is incorporated herein by reference in its entirety.

BACKGROUND

1. Field

The present disclosure relates to an X-ray detection panel and a method of manufacturing the same.

2. Discussion of the Related Technology

In general, an X-ray detector is adapted to detect radioactive rays which have transmitted through a human body and acquire desired radioactive ray image information, and a digital X-ray detector is adapted to convert image information of radioactive rays to electric signals and detect the converted electric signals.

Digital X-ray detectors are largely classified into direct mode detectors and indirect mode detectors according to a manner of converting X-rays into electric signals. The direct mode detector is adapted to directly convert irradiated X-rays to electric signals to detect the X-rays as an image signal, and the indirect mode detector is adapted to convert X-rays to visible rays and convert the visible rays to electric signals by using image sensor devices such as a photo diode and a CMOS or CCD sensor to realize an image.

A representative digital detector is configured to dispose scintillators on optical detectors arranged in one dimension or two dimensions and convert radioactive rays to light in the scintillators to detect them. Generally, the scintillators are made of CsI. The CsI is a hygroscopic material, and absorbs vapor (moisture) in the air to be resolved. Accordingly, properties of the scintillators, in particular, resolutions of the scintillators become degraded with time.

Thus, the scintillators should be protected from moisture, and WO98/036291 discloses a technology of protecting such scintillators. The gazette discloses a radioactive ray detecting device having a protective film for protecting a scintillator from moisture and a method of manufacturing the same, wherein the scintillating layer is completely sealed by the protective film, is isolated from the exterior air, and is protected from vapor in the air.

The foregoing discussion in this section is to provide general background information, and does not constitute an admission of prior art.

SUMMARY

An aspect of the present invention provides an X-ray detection panel by which an exposure of a scintillating layer can be maximally restrained by applying an adhesion layer in the form of a tape which can be more easily used and forming a protective film in a short time, making it possible to maximally restrain a change of the scintillating layer and shortening a process time.

An aspect provides an X-ray detection panel in which a protective film of a scintillating layer can be formed in a short time by applying an adhesion layer and which can prevent moisture from penetrating between the panel and the protective film, thereby enhancing a reliability of the product and improving a manufacturing process.

An aspect of the present invention also provides a method of manufacturing the X-ray detection panel.

In accordance with an aspect of the present invention, there is provided a method of manufacturing an X-ray detection panel, the method including: forming a sensor device over a substrate; forming an adhesion layer over the substrate in the form of a belt; forming a scintillating layer over the sensor device inside the adhesion layer; forming a protective film over the scintillating layer and the adhesion layer; irradiating at least a portion of the adhesion layer with light; removing an outer portion of the adhesion layer and a portion of the protective film formed over the outer portion of the adhesion layer; and forming a side sealing structure over a side surface of the adhesion layer, over a side surface of the protective film formed upon removing of the portion of the protective film located over the outer portion of the adhesion layer, and over an area of the substrate adjacent to the adhesion layer.

Here, the adhesion layer includes a first adhesion layer region and a second adhesion layer region which has adhesive force different from that of the first adhesion layer region. The first adhesion layer region is disposed inside the second adhesion layer region formed in the form of a belt and the second adhesion layer region is disposed outside the first adhesion layer region. In embodiments, an adhesive force of the first adhesion layer region may be greater than that of the second adhesion layer region. The outer portion of the adhesion layer which is removed may comprise at least a portion of the second adhesion layer region.

According to an embodiment of the present invention, the method may further include applying a primer material in a region where the adhesion layer is to be formed and forming a primer layer before the adhesion layer is formed.

According to an embodiment of the present invention, an adhesive force of the first adhesion layer region may be about 100 gf/25 mm to about 2000 gf/25 mm, and an adhesive force of the second adhesion layer region may be about 3 gf/25 mm to about 30 gf/25 mm.

According to an embodiment of the present invention, a width of the adhesion layer may be about 10 mm to about 100 mm.

According to an embodiment of the present invention, a width of the first adhesion layer region may be about 30% to about 60% of a width of the adhesion layer and a width of the second adhesion layer region may be 40 to 70% of a width of the adhesion layer.

According to an embodiment of the present invention, the adhesion layer may be disposed at a distance of about 20 mm to about 100 mm from an outermost end of the substrate.

According to an embodiment of the present invention, a laser may be irradiated in the step of irradiating light.

According to an embodiment of the present invention, the light may be irradiated to the second adhesion layer region in the step of irradiating light.

According to an embodiment of the present invention, the scintillating layer may be formed in a chamber.

According to an embodiment of the present invention, the protective film is formed of perylene.

According to an embodiment of the present invention, the side sealing structure may be formed of a silicon-based sealant.

According to an embodiment of the present invention, forming the side sealing structure may include: forming a partition wall over the protective film and another partition wall over the substrate outside the adhesion layer and the protective layer; filling a space between the formed partition walls with a filling resin material; and forming an upper sealing film over the filling resin material.

According to an embodiment of the present invention, the partition walls may be formed of a silicon-based sealant.

According to an embodiment of the present invention, the upper sealing film may be formed of a silicon-based sealant.

According to an embodiment of the present invention, the sensor device may comprise a TFT device.

In accordance with another aspect of the present invention, there is provided an X-ray detection panel including: a substrate; a sensor device formed over the substrate; a scintillating layer formed over the sensor device; an adhesion layer formed around the scintillating layer; a protective film formed over the scintillating layer and the adhesion layer; and a side sealing structure formed over a side surface of the adhesion layer, over a side surface of the protective film and over the substrate.

According to an embodiment of the present invention, a primer layer may be formed between the adhesion layer and the substrate.

According to an embodiment of the present invention, a width of the adhesion layer may be about 5 mm to about 60 mm.

According to an embodiment of the present invention, the adhesion layer may be formed at a distance of about 20 mm to about 100 mm from an outermost end of the substrate.

According to an embodiment of the present invention, the protective film may comprise perylene.

According to an embodiment of the present invention, the side sealing structure may be formed of a silicon-based sealant.

According to an embodiment of the present invention, the side sealing structure may include: a partition wall formed over the protective film and another partition wall formed over the substrate outside the adhesion layer and the protective film; a filling resin material filled between the partition walls; and an upper sealing film formed over the filling resin material.

According to an embodiment of the present invention, the partition walls may be formed of a silicon-based sealant.

According to an embodiment of the present invention, the upper sealing film may be formed of a silicon-based sealant.

According to an embodiment of the present invention, the sensor device may comprise a TFT device.

According to embodiments of the present invention, an exposure of the scintillating layer can be minimized by applying the adhesion layer provided in the form of a tape and forming the protective film in a short time, making it possible to restrain the scintillating layer from being degraded in the manufacturing process. As a result, the scintillating layer sensitive to foreign substances and moisture can be effectively protected.

Further, the adhesion layer is prevented from being loose or unfastened even when the protective film is removed by using the adhesion layer in the form of a tape. Thus, it is possible to prevent moisture from penetrating through an interface between layers.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF EMBODIMENTS

Hereinafter, embodiments of the present invention will be described with reference to the accompanying drawings.

The present invention may be variously modified and may have various forms, and embodiments will be illustrated in the drawings and be described in detail hereinbelow. However, the scope of the present invention is not limited only to those embodiments. It should be understood that modifications, equivalents, and replacements may be made without departing from the spirit and scope of the present invention, and those modifications, equivalents, and replacements fall within the scope of the present invention.

Although the terms used in the present application are those generally used in the art, some terms are arbitrarily selected by the applicant, in which case the meanings of the terms should be construed by considering the meanings used in the detailed description of the application.

Hereinafter, the parts irrelevant to features or configurations according to embodiments of the invention may be omitted for brevity and/or clarity, and the same or like reference numerals will be given to the same or like elements throughout the specification. The sizes and shapes in the drawings are not necessarily the same as the actual ones, but may be exaggerated for easier understanding of the invention.

An example of a method of manufacturing a radioactive ray detecting device is illustrated in FIGS. 1A to 1E. The method includes the steps of: forming a scintillating layer 30 on a device 20 formed on a substrate 10; forming a primary resin frame 40; coating a hygroscopic protective film 50 which transmits radioactive rays; removing the hygroscopic protective film 50 to expose a bonding pad part; and forming a secondary resin frame 60 at a margin of the protective film 50.

However, according to the foregoing manufacturing method, the formed scintillator is exposed while the primary resin frame 40 is formed after the scintillating layer 30 is formed. In addition, a bonding force between the primary resin frame 40 and the protective film 50 is not good, so a cutaway surface of the protective film 50 may get loose or become unfastened when the protective film on the pad part is removed. For this reason, the scintillating layer may be exposed to foreign substances and moisture, influencing the characteristics of a product and degrading process efficiency.

Embodiments of the present invention provide an X-ray detection panel to which an adhesion layer provided in the form of a tape is applied and a method of manufacturing the same.

Figure 2A:
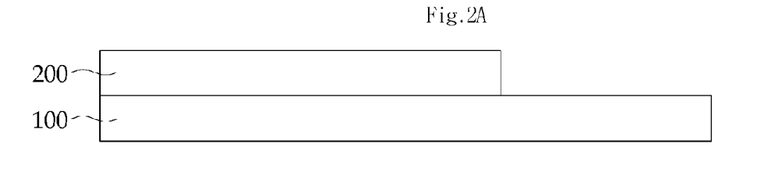
FIGS. 2A to 2F are views illustrating a process of manufacturing an X-ray detection panel according to an embodiment of the present invention.
Figure 2B:
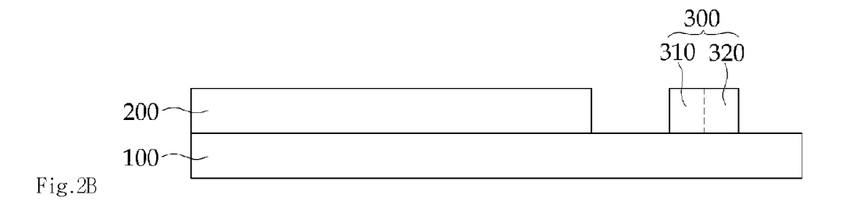
Figure 2C:
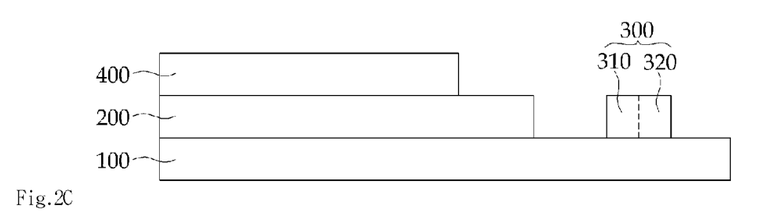
Figure 2D:
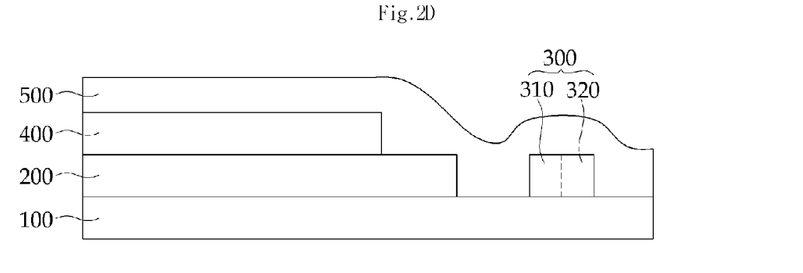
Figure 2E:
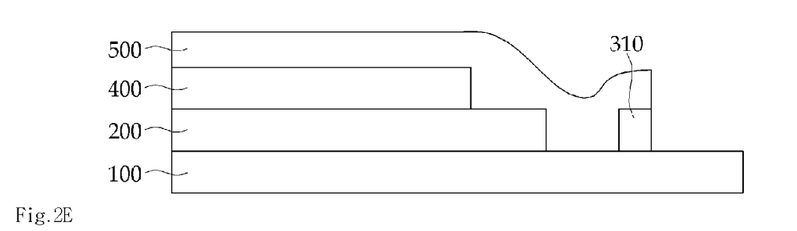
Figure 2F:
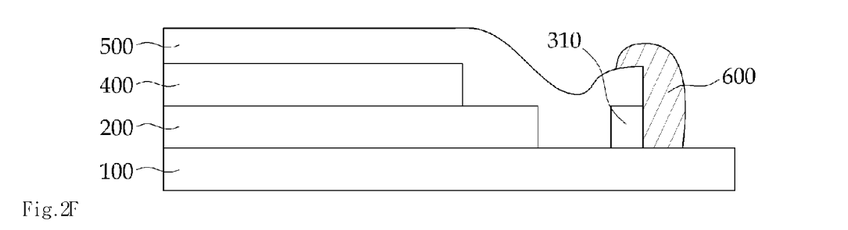

FIG. 2F shows an X-ray detection panel according to an embodiment of the present invention.

The X-ray detection panel illustrated in FIG. 2F includes a substrate 100; a sensor device 200 formed on the substrate 100; a scintillating layer 400 formed on the sensor device 200; an adhesion layer 310 formed around the scintillating layer 400; a protective film 500 formed on the scintillating layer 400 and the adhesion layer 310; and a sealing material 600 formed on a side of the adhesion layer, a side of the protective film and an area of the substrate 100 adjoining the adhesion layer. In embodiments illustrated in FIG. 2F and other drawings, the X-ray detection panel can include a multilayer structure which includes the substrate, the adhesion layer and the protective layer. At a side of the multilayer structure, an interface between two neighboring layers may be exposed. The sealing material 600 provides a side sealing structure that covers and seals the side of the multi layer structure and the exposed interfaces.

Figure 6A:
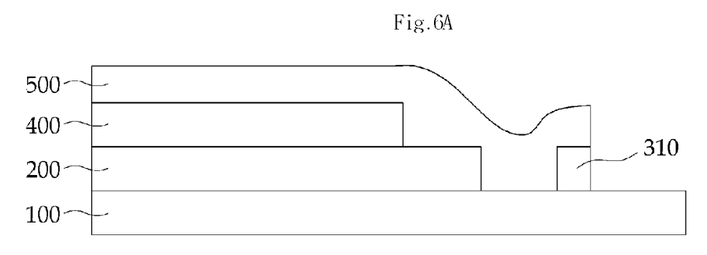
FIGS. 6A to 6D are views illustrating a step of forming a sealant according to another embodiment of the present invention.
Figure 6B:
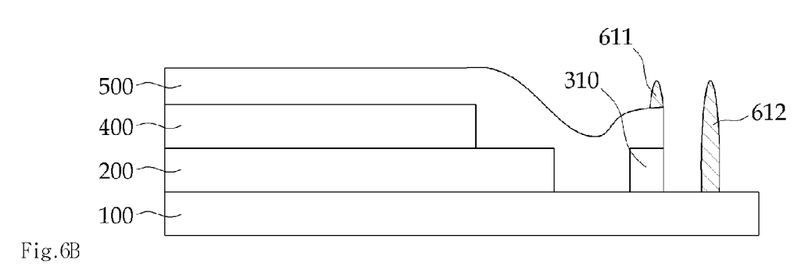
Figure 6C:
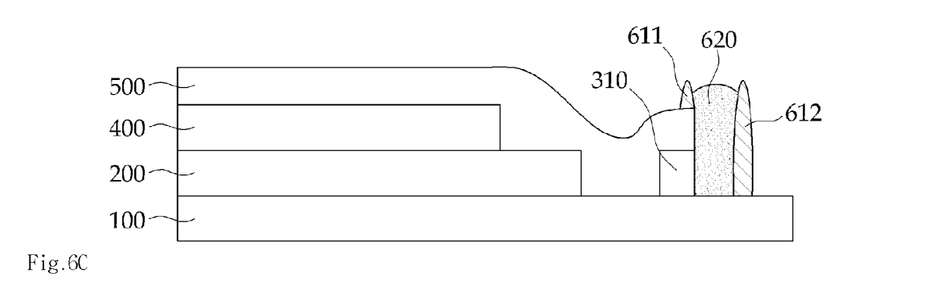
Figure 6D:
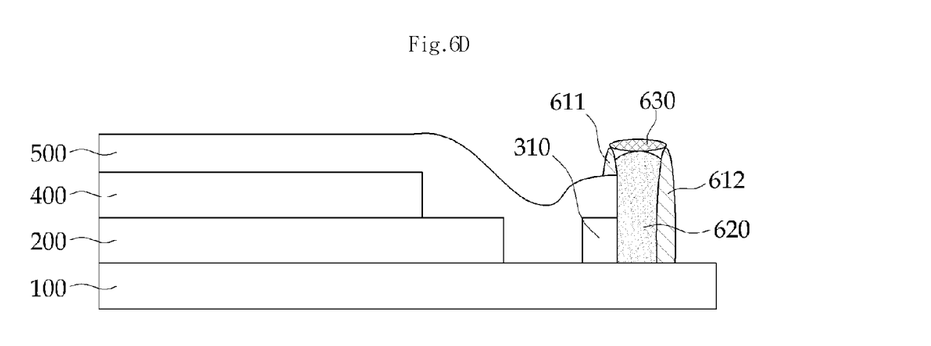

FIG. 6D shows an X-ray detection panel manufactured according to another embodiment of the present invention.

Figure 7:
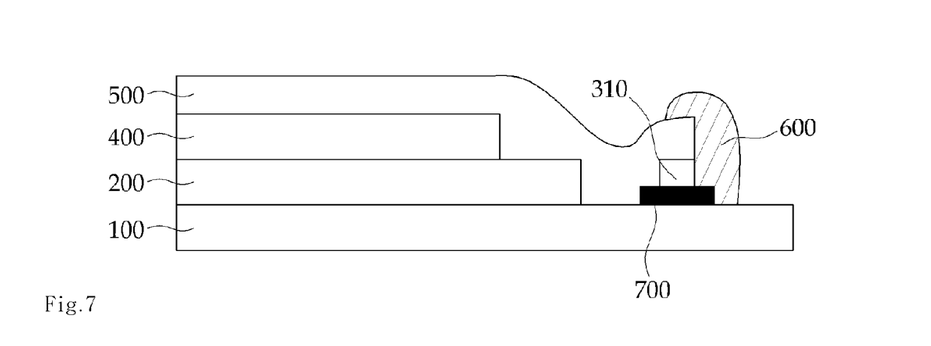
FIG. 7 is a view illustrating an X-ray detection panel manufactured according to still another embodiment of the present invention.

FIG. 7 shows an X-ray detection panel manufactured according to still another embodiment of the present invention.

The method of manufacturing the X-ray detection panel will be described in detail in the embodiments of the present invention with reference to the drawings.

Embodiment 1

Hereinafter, a method of manufacturing an X-ray detection panel according to embodiment 1 of the present invention will be described with reference to FIGS. 2A to 2F.

First, as illustrated in FIG. 2A, a sensor device 200 is formed on a substrate 100. Here, the substrate 100 may correspond to a glass substrate or a carbon substrate. A glass substrate is used in the embodiment of the present invention. A device capable of detecting strength of an electric signal may be used as the sensor device 200. A TFT may be used as such a device.

Figure 5:
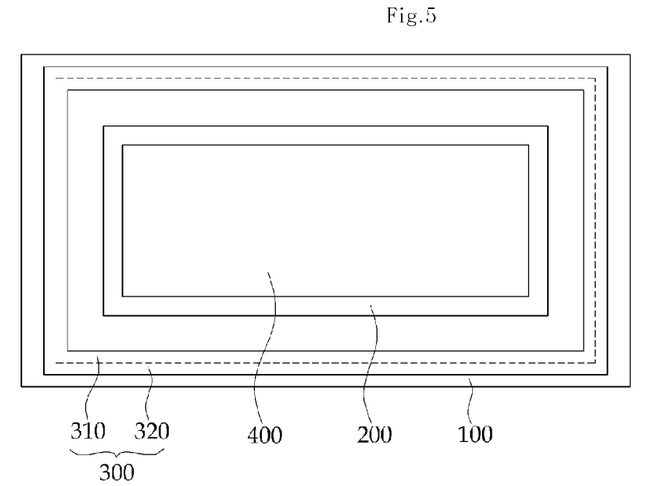
FIG. 5 is a top view of FIG. 2C viewed from the top.

Next, as illustrated in FIG. 2B, an adhesion layer 300 in the form of a belt is formed in a peripheral area of the substrate 100. Referring to FIG. 5, a view where an adhesion layer is disposed on a substrate can be confirmed. Here, the adhesion layer 300 may be disposed inwardly at a distance of about 20 mm to about 100 mm from an outermost end of the substrate 100. The width of the adhesion layer 300 may be about 10 mm to about 100 mm. The width of the adhesion layer 300 is not limited to the embodiment, but may be increased or decreased according to the conditions of the other elements.

The adhesion layer 300 includes a first adhesion layer region or section 310 and a second adhesion layer region or section 320 which have different adhesive forces. In illustrated embodiment, the adhesion layer 300 is divided into the first adhesion layer region 310 and the second adhesion layer region 320 in a direction of width as shown in FIGS. 2C, 2D and 5.

The first adhesion layer region 310 is disposed inside the second adhesion layer region formed in the form of a belt, and the second adhesion layer region 320 is formed outside the first adhesion layer region 310. In embodiments, an adhesive force of the first adhesion layer region 310 is greater than that of the second adhesion layer region 320.

Figure 3:
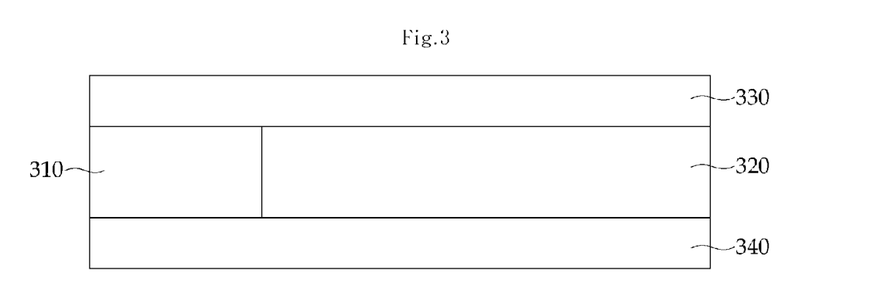
FIGS. 3 and 4 are views illustrating a tape including an adhesion layer according to embodiments of the present invention.

Referring to FIG. 3, the adhesion layer 300 including the first adhesion layer region 310 and the second adhesion layer region 320 may be provided by an adhesion tape manufactured in the form of a tape. An example of such an adhesion tape is an adhesion tape illustrated in FIG. 4.

Figure 4:
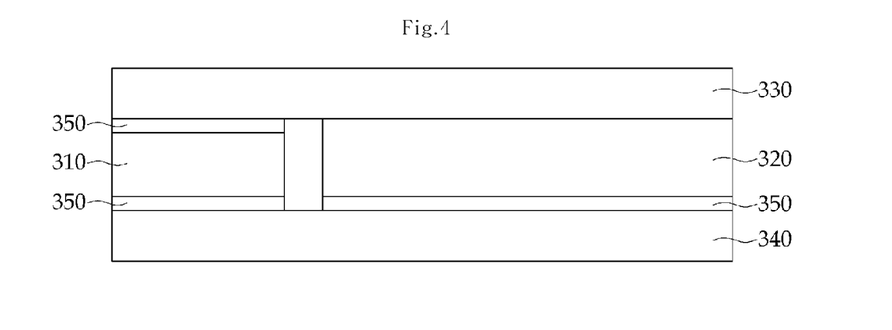

As illustrated in FIG. 4, the first adhesion tape 310 is spaced apart from the second adhesion tape 320 in the adhesion tape, and an upper release paper 330 and a lower release paper 340 may be attached on upper and lower surfaces of the adhesion tape by means of a bonding component 350 when they are manufactured.

In embodiments, the first adhesion layer region 310 is formed of an acryl-based adhesive whose adhesive force is about 100 gf/25 mm to about 2000 gf/25 mm, and the second adhesion layer region 320 is also formed of an acryl-based adhesive whose adhesive force is about 3 gf/25 mm to about 30 gf/25 mm.

As illustrated in FIG. 4, the adhesion layer 300 in the form of a belt is formed in a peripheral area of the substrate by using a tape including the first adhesion layer region 310, the second adhesion layer region 320, the upper release paper 330, and the lower release paper 340.

First, the tape from which the lower release paper 340 is removed is attached to the peripheral area of the substrate. Subsequently, if the upper release paper 330 is removed, the adhesion layer 300 including the first adhesion layer region 310 and the second adhesion layer region 320 is formed.

Next, as illustrated in FIG. 2C, a scintillating layer 400 is formed on the sensor device 200 inside the adhesion layer 300 formed in the form of a belt such that the adhesion layer 300 surrounds the sensor device 200 and the scintillating layer. Here, the step of forming the scintillating layer 400 is carried out in a vacuum chamber.

FIG. 5 is a top view where a structure constructed after the scintillating layer 400 is formed is viewed from the top. That is, FIG. 5 is a top view of FIG. 2C.

Next, as illustrated in FIG. 2D, a protective film 500 is formed on the scintillating layer 400 and the adhesion layer 300. Here, the type of the protective film 500 is not specifically limited, and may include those used in the art to which the present invention pertains. An example of the protective film 500 includes perylene. Since a perylene polymer has chemical-resistant, hygroscopic, and mechanical properties, it is widely used.

Next, as illustrated in FIG. 2E, light is irradiated to a part of the adhesion layer to selectively harden the adhesion layer. In more detail, light is irradiated to the second adhesion layer section 320 to harden the second adhesion layer section 320, weakening the adhesive force of the second adhesion layer section 320. Thereafter, the protective film 500 formed on the second adhesion layer portion 320 may be removed together with the second adhesion layer portion 320 by removing the second adhesion layer portion 320. In embodiments, the width of the first adhesion layer region 310 which is left after the second adhesion layer region 320 is removed is about 5 mm to about 60 mm. Here, a laser may be used as the irradiated light.

Finally, a sealing material or a side sealing structure 600 is formed on a side surface of the adhesion layer 300, a side surface of the protective film formed after the portion of the protective film formed on the adhesion layer 300 is removed, and a part of the substrate adjacent to the adhesion layer 300. In embodiments, the sealing material covers and contacts the side surface of adhesion layer, the side surface of the protective film and the area of the substrate. In embodiments, the sealing material or side sealing structure 600 is formed of a silicon-based sealing material.

The X-ray detection panel manufactured through the above-mentioned embodiment 1 is illustrated in FIG. 2F. The sizes and shapes of the substrate and the other elements are not limited to FIG. 2F, but may be increased or decreased.

Embodiment 2

Hereinafter, embodiment 2 of the present invention will be described with reference to FIGS. 2A to 2E and 6A to 6D.

A method of manufacturing an X-ray detection panel according to embodiment 2 of the present invention is carried out in the same process as the above-mentioned embodiment 1 except for the step of forming a sealing material 600.

First, as illustrated in FIGS. 6A and 6B, a first partition wall 611 is formed on the protective film and a second partition wall 612 is formed on the substrate outside the adhesion layer and the protective layer. In embodiments, the second wall 612 may be disposed in an area where a portion of the adhesion layer is removed. In embodiments, the first and second partition walls 611 and 612 may be formed of a silicon-based sealant, but are not limited thereto.

Next, as illustrated in FIG. 6C, a filling resin material 620 is filled between the formed first and second partition walls 611 and 612. Here, the type of the filling resin material 620 is not specifically limited. In embodiments, an epoxy resin can be used for the filling material 620.

Finally, an upper sealing film 630 is formed on the filling resin material 620. In embodiments, the upper sealing film 630 covers and contacts the filling material 620. In embodiments, the upper sealing film 630 may be formed of a silicon-based sealant, but is not specifically limited.

The X-ray detection panel manufactured through the embodiment 2 of the present invention is illustrated in FIG. 6D. The sizes and shapes of the substrate and the other elements are not limited to FIG. 6D, but may be increased or decreased.

Embodiment 3

Hereinafter, embodiment 3 of the present invention will be described with reference to FIGS. 2A to 2E and 7.

A method of manufacturing an X-ray detection panel according to embodiment 3 of the present invention includes the above-mentioned steps of embodiment 1 of the present invention, but further includes the step of forming a primer layer 700 before the step of forming an adhesion layer 300.

In more detail, the primer material 700 is applied in a region where the adhesion layer 300 is to be formed or attached before the adhesion layer 300 is formed. A primer generally used for bonding of a substrate may be used as the primer material. An example of such a primer includes an amine-based primer. The amine-based primer can be purchased commercially to be used. In the embodiment, a model name, BYC-C8000 (BYK co.) is used.

The X-ray detection panel manufactured through the above-mentioned embodiment 3 is illustrated in FIG. 7, and the primer layer 700 is formed between the first bonding layer region 310 and the substrate. The sizes and shapes of the substrate and the other elements are not limited to FIG. 7, but may be increased or decreased.

Experimental Examples

Figure 1A:
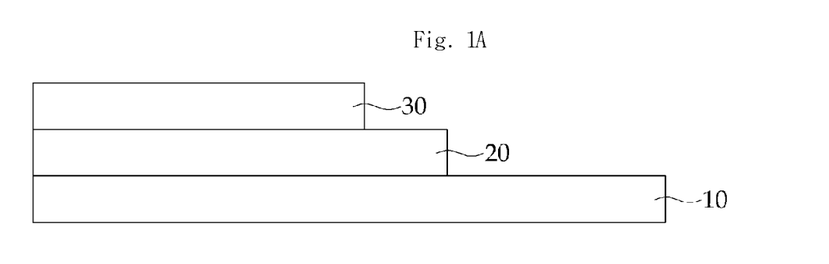
FIGS. 1A to 1E are views illustrating a process of manufacturing a X-ray detection panel.
Figure 1B:
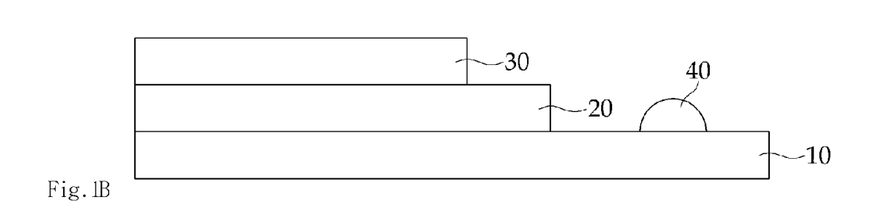
Figure 1C:
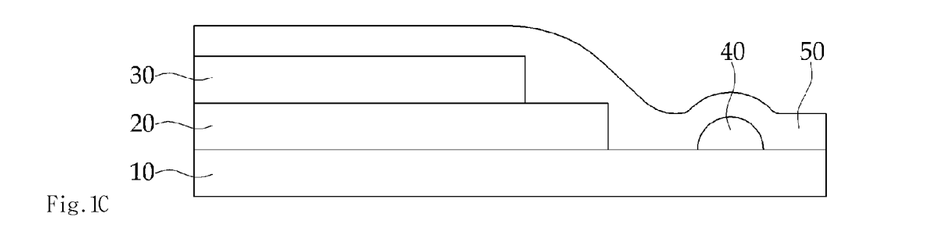
Figure 1D:
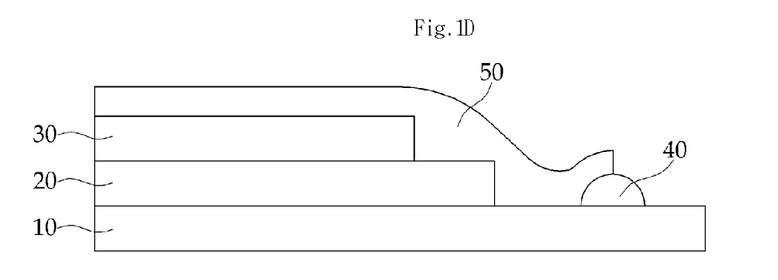
Figure 1E:
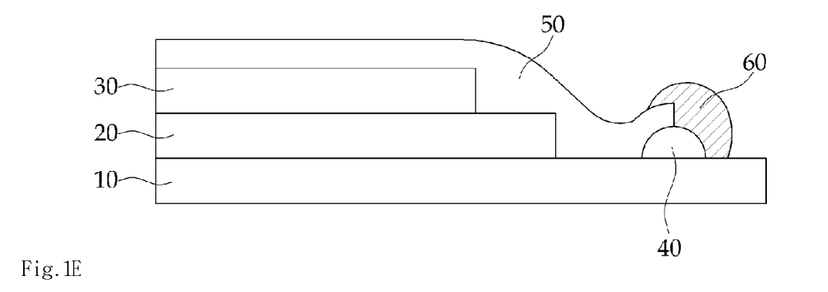

Evaluations with a confidence level of about 55% to about 95% were carried out with the X-ray detection panel (FIG. 2F, Experimental Example 1) where the adhesive layer and the sealant were formed, the X-ray detection panel (FIG. 7, Experimental Example 2) where the primer layer, the adhesion layer, and the sealant were formed, the X-ray detection panel (FIG. 1E, Compared Experimental Example 1) where the example resin frame is formed, and the X-ray detection panel (not shown, Compared Experimental Example 2) where the resin frame and the primer layer are formed.

As a result, the colors of the cobalt papers were not changed in Experimental Examples 1 and 2, but the colors of the cobalt papers were changed on both Compared Experimental Examples 1 and 2.

Through the result, it can be seen that an attaching force with the protective film can be increased by forming the adhesion layer, making it possible to prevent moisture from penetrating between the panel and the protective film.

What is claimed is:

1. A method of manufacturing an X-ray detection panel, the method comprising:
    forming a sensor device over a substrate;
    forming an adhesion layer over the substrate in the form of a belt;
    forming a scintillating layer over the sensor device inside the adhesion layer;
    forming a protective film over the scintillating layer and the adhesion layer;
    irradiating at least a portion of the adhesion layer with light;
    removing an outer portion of the adhesion layer and a portion of the protective film formed over the outer portion of the adhesion layer; and
    forming a side sealing structure over a side surface of the adhesion layer, over a side surface of the protective film formed upon removing of the portion of protective film located over the outer portion of the adhesion layer, and over an area of the substrate adjacent to the adhesion layer,
    wherein the adhesion layer comprises a first adhesion layer region and a second adhesion layer region which has adhesive force different from that of the first adhesion layer region,
    wherein the first adhesion layer region is disposed inside the second adhesion layer region formed in the form of a belt and the second adhesion layer region is disposed outside the first adhesion layer region, and
    wherein the outer portion of the adhesion layer which is removed comprises at least a portion of the second adhesion layer region.

2. The method as claimed in claim 1, further comprising applying a primer material in a region where the adhesion layer is to be formed and forming a primer layer before the adhesion layer is formed.

3. The method as claimed in claim 1, wherein an adhesive force of the first adhesion layer region is greater than an adhesive force of the second adhesion layer region.

4. The method as claimed in claim 1, an adhesive force of the first adhesion layer region is about 100 gf/25 mm to about 2000 gf/25 mm, and an adhesive force of the second adhesion layer region is about 3 gf/25 mm to about 30 gf/25 mm.

5. The method as claimed in claim 1, wherein a width of the adhesion layer is about 10 mm to about 100 mm.

6. The method as claimed in claim 1, wherein a width of the first adhesion layer region is about 30% to about 60% of a width of the adhesion layer and a width of the second adhesion layer region is about 40% to about 70% of a width of the adhesion layer.

7. The method as claimed in claim 1, wherein the adhesion layer is disposed at a distance of about 20 mm to about 100 mm from an outermost end of the substrate.

8. The method as claimed in claim 1, wherein a laser is irradiated in the step of irradiating light.

9. The method as claimed in claim 1, wherein the light is irradiated to the second adhesion layer region in the step of irradiating light.

10. The method as claimed in claim 1, wherein the scintillating layer is formed in a chamber.

11. The method as claimed in claim 1, wherein the protective film is formed of perylene.

12. The method as claimed in claim 1, wherein the side sealing structure is formed of a silicon-based sealant.

13. The method as claimed in claim 1, wherein forming the side sealing structure comprises:
   forming a partition wall over the protective film and another partition wall over the substrate outside the adhesion layer and the protective layer;
   filling a space between the formed partition walls with a filling resin material; and
   forming an upper sealing film over the filling resin material.

14. The method as claimed in claim 13, wherein the partition walls are formed of a silicon-based sealant.

15. The method as claimed in claim 13, wherein the upper sealing film is formed of a silicon-based sealant.

16. The method as claimed in claim 1, wherein the sensor device comprises a TFT device.

17. An X-ray detection panel comprising:
   a substrate;
   a sensor device formed over the substrate;
   a scintillating layer formed over the sensor device;
   an adhesion layer formed around the scintillating layer;
   a protective film formed over the scintillating layer and the adhesion layer; and
   a side sealing structure formed over a side surface of the adhesion layer, over a side surface of the protective film and over the substrate.

18. The X-ray detection panel as claimed in claim 17, wherein a primer layer is formed between the adhesion layer and the substrate.

19. The X-ray detection panel as claimed in claim 17, wherein a width of the adhesion layer is about 5 mm to about 60 mm.

20. The X-ray detection panel as claimed in claim 17, wherein the adhesion layer is formed at a distance of about 20 mm to about 100 mm from an outermost end of the substrate.

21. The X-ray detection panel as claimed in claim 17, wherein the protective film comprises perylene.

22. The X-ray detection panel as claimed in claim 17, wherein the side sealing structure is formed of a silicon-based sealant.

23. The X-ray detection panel as claimed in claim 17, wherein the side sealing structure comprises:
   a partition wall formed over the protective film and another partition wall formed over the substrate outside the adhesion layer and the protective film;
   a filling resin material filled between the partition walls; and
   an upper sealing film formed over the filling resin material.

24. The X-ray detection panel as claimed in claim 23, wherein the partition walls are formed of a silicon-based sealant.

25. The X-ray detection panel as claimed in claim 23, wherein the upper sealing film is formed of a silicon-based sealant.

26. The X-ray detection panel as claimed in claim 17, wherein the sensor device comprises a TFT device.

\* \* \* \* \*